(12) United States Patent  
Tang et al.

(10) Patent No.: US 7,957,208 B1  
(45) Date of Patent: Jun. 7, 2011

(54) FLEXIBLE MEMORY ARCHITECTURES FOR PROGRAMMABLE LOGIC DEVICES

(75) Inventors: Howard Tang, San Jose, CA (US);  
Fabiano Fontana, San Jose, CA (US);  
David L. Rutledge, Hillsboro, OR (US);  
Om P. Agrawal, Los Altos, CA (US);  
Henry Law, Los Altos, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 283 days.

(21) Appl. No.: 12/389,149

(22) Filed: Feb. 19, 2009

Related U.S. Application Data (63) Continuation of application No. 11/446,309, filed on Jun. 2, 2006, now Pat. No. 7,495,970.

(51) Int. Cl.  
*G11C 7/00* (2006.01)

(52) U.S. Cl. .......... 365/189.2; 326/39; 365/189.08; 365/230.05

(58) Field of Classification Search .......... 365/189.2, 365/189.08, 230.05; 326/39  
See application file for complete search history.

(56) References Cited

U.S. PATENT DOCUMENTS

| | | | | |
|---|---|---|---|---|
| 5,548,228 A * | 8/1996 | Madurawe | 326/41 |
| 5,640,107 A * | 6/1997 | Kruse | 326/38 |
| 5,689,516 A * | 11/1997 | Mack et al. | 714/725 |
| 5,696,455 A * | 12/1997 | Madurawe | 326/41 |
| 5,794,033 A * | 8/1998 | Aldebert et al. | 713/100 |
| 6,038,185 A * | 3/2000 | Ng et al. | 365/221 |
| 6,044,025 A * | 3/2000 | Lawman | 365/191 |
| 6,049,222 A * | 4/2000 | Lawman | 326/38 |
| 6,150,837 A * | 11/2000 | Beal et al. | 326/39 |
| 6,304,099 B1 * | 10/2001 | Tang et al. | 326/38 |
| 6,356,107 B1 * | 3/2002 | Tang et al. | 326/40 |
| 6,467,009 B1 * | 10/2002 | Winegarden et al. | 710/305 |
| 6,483,342 B2 * | 11/2002 | Britton et al. | 326/39 |
| 6,507,214 B1 * | 1/2003 | Snyder | 326/38 |
| 6,538,468 B1 * | 3/2003 | Moore | 326/40 |
| 6,564,285 B1 * | 5/2003 | Mills et al. | 711/103 |
| 6,704,850 B1 * | 3/2004 | Reynolds | 711/170 |
| 6,714,041 B1 * | 3/2004 | Darling et al. | 326/38 |
| 6,721,840 B1 * | 4/2004 | Allegrucci | 710/306 |
| 6,732,263 B1 * | 5/2004 | May et al. | 713/1 |
| 6,772,230 B2 * | 8/2004 | Chen et al. | 710/8 |
| 6,774,668 B1 * | 8/2004 | Wirtz, II | 326/37 |
| 6,785,165 B2 * | 8/2004 | Kawahara et al. | 365/185.28 |
| 6,828,823 B1 * | 12/2004 | Tsui et al. | 326/40 |
| 6,851,047 B1 * | 2/2005 | Fox et al. | 713/1 |
| 6,873,177 B1 * | 3/2005 | Wennekamp et al. | 326/8 |
| 6,903,574 B2 * | 6/2005 | Chen et al. | 326/41 |

(Continued)

OTHER PUBLICATIONS

ATMEL Corporation, AT17LV(A) Series FPGA Configuration Memory, Ref. 0437K-CNFG, May 2003, pp. 1-18.*

(Continued)

*Primary Examiner* — Alexander Sofocleous (57) ABSTRACT

In one embodiment, a programmable logic device includes a plurality of logic blocks; a plurality of input/output blocks; volatile configuration memory adapted to store configuration data for configuration of the logic blocks and input/output blocks; embedded block RAM adapted to store user data; flash memory having at least a first partition and a second partition; and a data port adapted to provide external device access to the first partition of the non-volatile memory. The flash memory is adapted to store within the first partition user data from the data port and is further adapted to store within the second partition user data from the embedded block RAM.

18 Claims, 6 Drawing Sheets

U.S. PATENT DOCUMENTS

| | | | |
|---|---|---|---|
| 7,088,132 B1 * | 8/2006 | Tang et al. | 326/39 |
| 7,095,247 B1 * | 8/2006 | Tang et al. | 326/38 |
| 7,099,189 B1 * | 8/2006 | Plants | 365/185.08 |
| 7,190,190 B1 * | 3/2007 | Camarota et al. | 326/38 |
| 7,196,963 B1 * | 3/2007 | Fenstermaker et al. | 365/230.05 |
| 7,227,380 B2 * | 6/2007 | Elftmann et al. | 326/40 |
| 7,242,218 B2 * | 7/2007 | Camarota et al. | 326/41 |
| 7,375,549 B1 * | 5/2008 | Tang et al. | 326/38 |
| 7,378,873 B1 * | 5/2008 | Tang et al. | 326/41 |
| 7,459,931 B1 * | 12/2008 | Tang et al. | 326/38 |
| 7,538,574 B1 * | 5/2009 | Tang et al. | 326/38 |
| 7,554,357 B2 * | 6/2009 | Chen et al. | 326/39 |
| 7,554,358 B1 * | 6/2009 | Fontana et al. | 326/41 |
| 2004/0061147 A1 * | 4/2004 | Fujita et al. | 257/232 |
| 2004/0064622 A1 * | 4/2004 | Smith | 710/305 |
| 2005/0189962 A1 * | 9/2005 | Agrawal et al. | 326/41 |

OTHER PUBLICATIONS

ATMEL Corporation, FPGA Configuration EEPROM Memory, 2322F-CNFG, Jun. 2006, pp. 1-18.*

ATMEL Corporation, FPGA Configuration EEPROM Memory, 2321 E-CNFG, Jun. 2003, pp. 1-18.*

Lattice Semiconductor Corporation, MachXO Family Data Sheet, Version 02.1, May 2006, pp. 1-93.*

Altera, Section III User Flash Memory, Max II Device Handbook, vol. 1, 2005, 80 pages.*

Actel, ProASIC 3 Flash Family FPGAs with Optional Soft ARM Support, Advanced v0.6, Apr. 2006, 208 pages.*

Altera Corporation, Cyclone Device Handbook, vol. 1, 13. Configuring Cyclone FPGAs, Aug. 2005, 50 pages.*

Lattice Semiconductor Corporation, Low-Cost FPGA Configuration Via Industry-Standard SPI Serial Flash, A Lattice Semiconductor White Paper, Jun. 2004, 13 pages.*

Xilinx, Configuring Spartan-3E Xilinx FPGAs with SPI Flash Memories, Arthur Khu, Jan. 3, 2006, 16 pages.*

ST Microelectronics, M25P80, 8 Mbit Low Voltage Serial Flash Memory with 40 MHz SPI Bus Interface, Aug. 2004, 41 pages.*

Lattice Semiconductor Corporation, ispXP Configuration Usage Guidelines, Technical Notes TN1026, Aug. 2002, pp. 1-18.*

Lattice Semiconductor Corporation, ispXPGA Family, Data Sheet, Jul. 2005, 115 pages.*

Lattice Semiconductor Corporation, ispXPGA Family, Preliminary Data Sheet, Dec. 2002, pp. 1-90.*

Lattice Semiconductor Corporation, LatticeXP Family Data Sheet, Version 01.0, Feb. 2005, 77 pages.*

Altera, Max II Device Handbook, http://www.altera.com, M115V-1.7, Jun. 2005, 330 pages.*

Xilinx, on the Fly Reconfiguration with CoolRunner-II CPLDs, Application Note: CoolRunner-II CPLDs, May 2003, pp. 1-10.*

Actel, ProASIC Plus Flash Family FPGAs, v.5.3, May 2006, 173 pages.*

Actel, ProASIC 3 Flash Family FPGAs, ARM7 Soft IP Support in ProASIC3E ARM7-Ready Devices, Oct. 2005, 166 pages.*

Lattice Semiconductor Corporation, Lattice XP Family Data Sheet, v.04.6, Jun. 2006 and earlier, 36 pages.*

Lattice Semiconductor Corporation, MachXO Family Data Sheet, v.02.1, May 2006 and earlier, 30 pages.*

* cited by examiner

FLEXIBLE MEMORY ARCHITECTURES FOR PROGRAMMABLE LOGIC DEVICES

RELATED APPLICATION DATA

This application is a continuation of U.S. application Ser. No. 11/446,309, filed Jun. 2, 2006, which is incorporated by reference in its entirety.

TECHNICAL FIELD

The present invention relates generally to electrical circuits and, more particularly, to memory within programmable logic devices.

BACKGROUND

A programmable logic device, such as field programmable gate array (FPGA) or a complex programmable logic device (CPLD), may be used in a variety of applications. A programmable logic device (PLD) offers the advantage of being reprogrammable in the field (e.g., while on the circuit board in its operational environment).

A drawback of a conventional PLD is that, while its configuration memory is being reprogrammed, the PLD typically cannot preserve data stored in its volatile memory (e.g., volatile embedded random access memory (RAM) blocks) and, consequently, the data is lost during the reprogramming process. However, depending upon the particular application, a user of the PLD may prefer to preserve the data stored in the volatile memory for use within the PLD after the reprogramming (i.e., reconfiguration) of the PLD has been completed and the PLD is operating based upon the new configuration data provided during the reprogramming.

Furthermore, a conventional PLD generally does not provide reprogrammable non-volatile memory that a user can directly access for storing desired user information. Thus for example, the conventional PLD would first have to be configured to programmably provide direct user access to the non-volatile memory for storing the desired user information. As a result, there is a need for improved memory and reconfiguration techniques for PLDs.

SUMMARY

In one embodiment of the invention, a programmable logic device includes a plurality of logic blocks; a plurality of input/output blocks; volatile memory adapted to store configuration data for configuration of the logic blocks and input/output blocks and further adapted to store user data; non-volatile memory having at least a first part and a second part; and a data port adapted to provide external device access to the first part of the non-volatile memory. The non-volatile memory is adapted to store within the first part user data from the data port and is further adapted to store within the second part user data from the volatile memory.

In another embodiment of the invention, a programmable logic device includes a plurality of logic blocks; a plurality of input/output blocks; volatile configuration memory adapted to store configuration data for configuration of the logic blocks and input/output blocks; embedded block RAM adapted to store user data; flash memory having at least a first partition and a second partition; and a data port adapted to provide external device access to the first partition of the non-volatile memory. The flash memory is adapted to store within the first partition user data from the data port and is further adapted to store within the second partition user data from the embedded block RAM.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
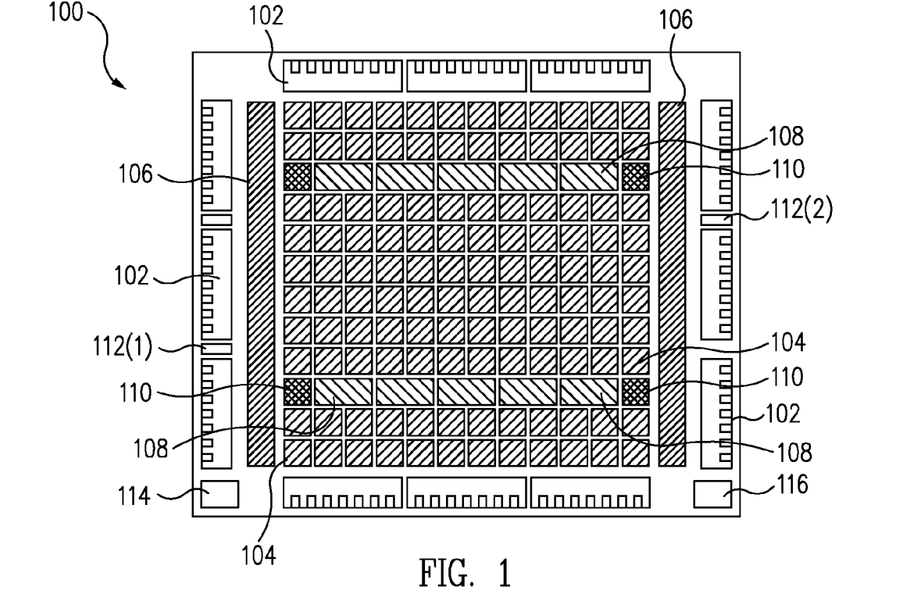
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 generally includes input/output (I/O) blocks 102 and programmable logic blocks 104. I/O blocks 102 provide I/O functionality (e.g., supports one or more I/O and/or memory interface standards) for PLD 100. Programmable logic blocks 104 (e.g., also referred to in the art as configurable logic blocks or logic array blocks) provide logic functionality for PLD 100, such as LUT-based logic typically associated with FPGAs or array-based logic typically associated with CPLDs.

PLD 100 may also include reprogrammable non-volatile memory 106 (e.g., blocks of EEPROM or flash memory), volatile memory 108 (e.g., block SRAM), clock-related circuitry 110 (e.g., PLL circuits), one or more data ports 112, configuration memory 114, and/or an interconnect 116. It should be understood that the number and placement of the various elements, such as I/O blocks 102, logic blocks 104, non-volatile memory 106, volatile memory 108, clock-related circuitry 110, data port 112, configuration memory 114, and interconnect 116, is not limiting and may depend upon the desired application. Furthermore, it should be understood that the elements are illustrated in block form for clarity and that certain elements, such as configuration memory 114 and interconnect 116, would typically be distributed throughout PLD 100, such as in and between logic blocks 104, to perform their conventional functions (e.g., storing configuration data that configures PLD 100 and providing routing resources, respectively).

Data port 112 may be used for programming PLD 100, as would be understood by one skilled in the art. For example, data port 112(1) may represent a programming port such as a central processing unit (CPU) port (also referred to as a peripheral data port or a sysCONFIG programming port) and/or a serial peripheral interface (SPI) port. Data port 112 (2) may represent, for example, a programming port such as a joint test action group (JTAG) port by employing standards such as Institute of Electrical and Electronics Engineers (IEEE) 1149.1 or 1532 standards. Data ports 112(1) and 112(2) are not both required, but one or the other or both may be included to receive configuration data and commands, depending upon the desired application and requirements as discussed further herein in accordance with one or more embodiments of the present invention.

Non-volatile memory 106 may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Non-volatile memory 106 may also be used to provide background programming and/or storage for PLD 100 in accordance with some embodiments of the present invention. For example for storage functionality, non-volatile memory 106 may be used to store data from volatile memory 108 during the reconfiguration process in accordance with an embodiment of the present invention. Thus as an example, the data stored by volatile memory 108 within PLD 100, just prior to reconfiguration, may be preserved in non-volatile memory 106 during the reconfiguration process and then written back into volatile memory 108 prior to returning to user mode, as explained further herein.

As another example for storage functionality, a non-volatile memory (e.g., as part of non-volatile memory 106 and referred to herein as a tag memory) may be provided with direct access by a user of the PLD in accordance with an embodiment of the present invention. For example, the tag memory may be used to replace embedded EEPROM memory blocks or other conventional non-volatile memory and store various desired user and/or manufacturer information (e.g., system management and/or control information, such as electronic ID codes, version management information, date stamping, manufacturing version control information, asset management and tracking, system calibration settings, device serialization, and/or inventory control).

For example for background programming, PLD 100 may remain in user mode, based on the configuration data stored in configuration memory 114 within PLD 100, while non-volatile memory 106 is programmed with new configuration data (e.g., a new user defined pattern). Once the new configuration data is stored in non-volatile memory 106, this data can be transferred from non-volatile memory 106 to configuration memory 114 to reconfigure PLD 100, a process sometimes referred to as refresh. The refresh process can be initiated by a signal or instruction provided to data port 112 (e.g., pulsing data port 112(1) or providing a JTAG refresh instruction via data port 112(2)).

Figure 2:
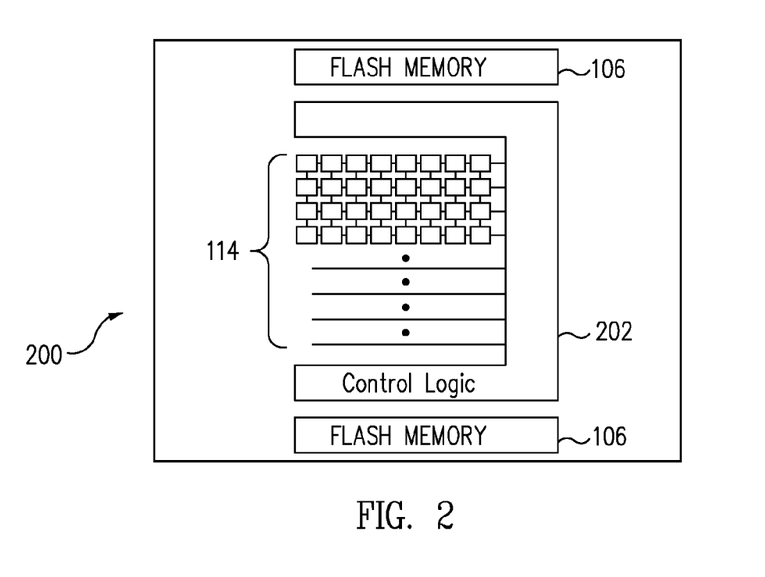
FIG. 2 shows a block diagram illustrating exemplary implementation details for a non-volatile memory and configuration memory of the programmable logic device of FIG. 1 in accordance with an embodiment of the present invention.

As a specific example, FIG. 2 shows a block diagram illustrating a PLD 200, which provides exemplary implementation details for PLD 100 of FIG. 1 in accordance with an embodiment of the present invention. PLD 200 includes non-volatile memory 106 (e.g., flash memory), configuration memory 114, and control logic 202.

Configuration memory 114 (e.g., volatile SRAM cells or other types of volatile or non-volatile memory) are used in a conventional manner to store configuration data, which determines the user defined functions of PLD 200 (e.g., determines programmable functions of I/O blocks 102, logic blocks 104, and interconnect 116). Control logic 202 controls, for example in accordance with an embodiment of the present invention, the internal transfer of the configuration data from non-volatile memory 106 to configuration memory 114 and may also control the transfer of data from data ports 112 to non-volatile memory 106 and configuration memory 114, as would be understood by one skilled in the art.

It should be understood that flash memory represents an exemplary type of memory for non-volatile memory 106, but other types of non-volatile memory (e.g., EECMOS) that can be reprogrammed once or repeatedly may be substituted for non-volatile memory 106. Furthermore, either non-volatile memory 106 or configuration memory 114 may be programmed (i.e., receive and store information in its memory) to store configuration data for PLD 200, but the device functionality of PLD 200 is determined by the information stored in configuration memory 114. Thus, PLD 200 may be configured (including reconfiguration or partial reconfiguration), for example, when information is programmed into configuration memory 114.

It should also be understood, in accordance with one or more embodiments of the present invention, that non-volatile memory 106 and configuration memory 114 may each be programmed (including reprogrammed), for example, via data port 112(1) or data port 112(2), depending upon the desired application or design requirements. Further details regarding programming may be found in U.S. Pat. No. 6,828, 823 and U.S. Patent Application Publication No. 2005/0189962 A1, published Sep. 1, 2005.

In general, during programming of configuration memory 114 and reconfiguration of the PLD (e.g., PLD 100), it may be desired by a user of the PLD to preserve data stored in volatile memory 108. However for conventional approaches, any information stored in volatile memory 108 generally cannot be saved and is lost during the reconfiguration process. Furthermore, if flash memory is embedded within the PLD to provide non-volatile memory, the flash memory typically is limited. For example, the flash memory may have an inadequate, fixed amount of storage space, a slow read/write access speed, a limited number of possible read/write cycles, limited access (e.g., access to the flash memory only if the PLD has been configured), and/or undesirable data structure restrictions.

In contrast for example, in accordance with one or more embodiments of the present invention, techniques are disclosed to preserve the data stored in volatile memory 108 during a reconfiguration and/or provide immediate access to non-volatile memory (i.e., tag memory) within the PLD for user and/or manufacturer access and information storage. For example for data preservation, non-volatile memory 106 may be partitioned to provide storage for configuration data (e.g., a configuration flash section) and to provide non-volatile storage (i.e., a user flash section) for volatile memory 108 (e.g., to preserve the data through a reconfiguration, if desired by a user of the PLD). Furthermore in accordance with some embodiments it should be understood that, rather than partitioning one non-volatile memory 106, one or more of non-volatile memory 106 may be implemented to provide non-volatile storage for volatile memory 108, while one or more of non-volatile memory 106 may be implemented to provide non-volatile storage for configuration data.

Thus, for example for some embodiments, non-volatile memory 106 may be used as non-volatile storage for a user to store not only various information, such as system management information, manufacturing control information, and/or failure statistics information for board level diagnostics, but also to store in a non-volatile fashion data from volatile memory 108 to preserve during a reconfiguration or power down of PLD 100 (also referred to as store-to-flash capability). Furthermore, in accordance with one or more embodiments of the present invention, one or more blocks of volatile memory 108 may be operated as shadow flash memory during user mode of operation to provide fast, random, and unlimited read/write access as well as a flexible, scalable data structure capability. Consequently, in accordance with some embodiments, volatile memory 108 may function as virtual user flash memory with store-to-flash capability to preserve the data during a reconfiguration (e.g., transparent field reconfiguration capability).

Figure 3:
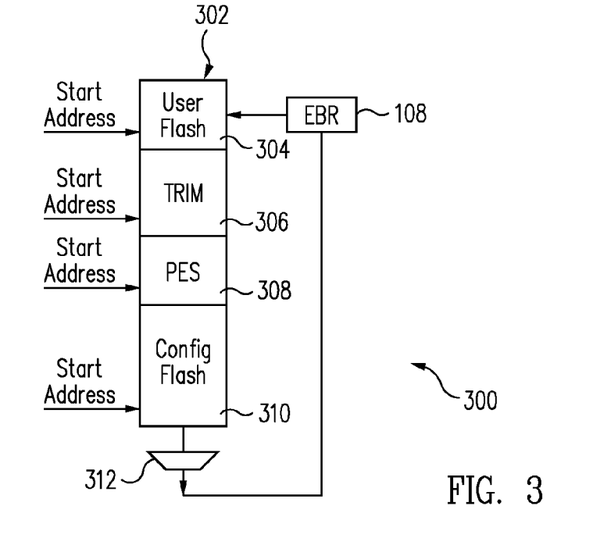
FIG. 3 shows a block diagram illustrating exemplary implementation details for a non-volatile memory and a volatile memory of the programmable logic device of FIG. 1 in accordance with an embodiment of the present invention.

For example, FIG. 3 shows a PLD 300, which illustrates exemplary implementation details for a non-volatile memory 302 and volatile memory 108 (e.g., labeled EBR for embedded block RAM) of PLD 100 of FIG. 1 in accordance with an embodiment of the present invention. PLD 300 illustrates the general functionality for non-volatile memory 302 and volatile memory 108 in accordance with some embodiments. For example, non-volatile memory 302 may be used to store data from volatile memory 108, which allows volatile memory 108 to be used as virtual flash memory (e.g., also referred to as shadow flash) during a user mode of operation.

Specifically as an example, non-volatile memory 302 may represent a specific implementation example for non-volatile memory 106, with non-volatile memory 302 partitioned (segmented) into a user flash portion 304, a trim portion 306, a test portion 308, and a configuration flash portion 310 (with trim portion 306 and test portion 308 being optional portions within non-volatile memory 302). User flash portion 304 may be used to store data for volatile memory 108 in a non-volatile manner, such as to preserve the data stored by volatile memory 108 during a reconfiguration of PLD 300 (e.g., a store-to-flash (STF) operation).

Trim portion 306 may be used to store trim data, which may be used for adjusting or trimming various parameters within PLD 300 (e.g., adjusting current source values, resistor values, or other circuit parameters as would be understood by one skilled in the art). Test portion 308 (e.g., also referred to as program electronic signature (PES) in one embodiment) may be used to store test data and other types of information, as desired. Configuration flash portion 310 may be used to store configuration data for transfer to configuration memory 114 to reconfigure PLD 300.

As shown in FIG. 3, non-volatile memory 302 (e.g., flash memory) may have a different starting address for each portion or section. User flash portion 304 may be accessed sequentially and coupled (e.g., via routing resources 312, such as with multiplexers and other circuitry associated with interconnect 116) to its associated volatile memory 108. Therefore, data can be loaded into volatile memory 108 from user flash portion 304 (e.g., during reconfiguration or as desired) and volatile memory 108 can be accessed randomly during user mode of operation. If all or a portion of PLD 300 which includes volatile memory 108 is to be reconfigured, the data in volatile memory 108 which is desired to be preserved through the reconfiguration process may be loaded into user flash portion 304 (e.g., under control of a store-to-flash (STF) command).

In general in accordance with an embodiment of the present invention, non-volatile memory 302 illustrates the partitioning of flash memory into configuration flash portion 310 (e.g., a configuration flash area) and user flash portion 304 (e.g., a user flash area), which allows volatile memory 108 to function, if desired by a user, as shadow flash memory (e.g., virtual flash memory) with STF capability. Configuration flash portion 310 may be used to store and provide configuration data to configuration memory 114 (e.g., provide initializing configuration logic), while user flash portion 304 may be used to store data for volatile memory 108 and provide data for initializing volatile memory 108 (e.g., volatile memory 108 is the primary interface with user flash portion 304). Non-volatile memory 302 may further include additional areas (e.g., trim portion 306 and test portion 308) to provide additional memory for users to store other information based on their specific requirements or application.

The techniques illustrated herein may provide certain advantages over a conventional PLD. For example, by utilizing volatile memory 108 as virtual flash memory, there may be certain benefits over conventional techniques in terms of power consumed, speed (e.g., fast accessibility), accessibility (e.g., random, unlimited read/write), and data structure (e.g., flexible data structure and organization). By utilizing volatile memory 108 as shadow user flash, less power may be consumed relative to using non-volatile memory 302 directly. Volatile memory 108 can function as shadow user flash and provide virtual user flash capability as desired by a user due to the STF capability for user flash portion 304. The amount of shadow user flash provided by PLD 300 may vary and scale with device density (e.g., from 180 k bits to 400 k bits or more) and may be organized as one or more separate shadow user flash blocks, as described further herein.

Volatile memory 108 may also provide speed advantages relative to flash technology. For example, shadow user flash may be accessed at the speed of the volatile memory technology of volatile memory 108 rather than the relatively slow read/write speeds of non-volatile memory 302. Thus, by using volatile memory 108 as shadow user flash, virtual non-volatile storage space may be provided at the speed of SRAM technology, for example, if volatile memory 108 is implemented as SRAM.

Volatile memory 108 may also provide accessibility advantages over non-volatile memory 302. For example, volatile memory 108 may provide random read/write access capability as shadow user flash, rather than the typically more restricted sequential access of non-volatile memory 302 (e.g., implemented as flash technology). Furthermore for example, volatile memory 108 may provide essentially unlimited read/write access capability, rather than the typically more restrictive endurance limitations applied to the read/write access capability of non-volatile memory 302 (e.g., not limited by the endurance limitations of flash technology).

Volatile memory 108 may also provide flexible data structure, organization, and access capability. For example, by using volatile memory 108 (e.g., SRAM block), the conventional routing and addressing structure may be utilized to provide flexible data access, with volatile memory 108 providing flexible data width organization and, for multiple blocks of volatile memory 108, cascading for both width and depth data structure flexibility. For example, volatile memory 108 may provide various data structure access flexibility (e.g., by 1, by 2, by 4, by 8, by 16, by 32, by 36, etc., such as 16K by 1, 8K by 2, 4K by 4, 2K by 8, 1K by 18, 512 by 36, etc.).

The techniques disclosed herein may provide additional benefits or advantages. For example, there does not have to be any special-purpose or dedicated routing and interconnect to use volatile memory 108 as shadow user flash, but rather the PLD's inherent routing structure (e.g., interconnect 116) may be used. Furthermore, the use of volatile memory 108 as shadow user flash is flexible and user-controlled by providing STF control capability for saving the information stored in volatile memory 108 to non-volatile memory 302 (e.g., flash memory).

Figure 4:
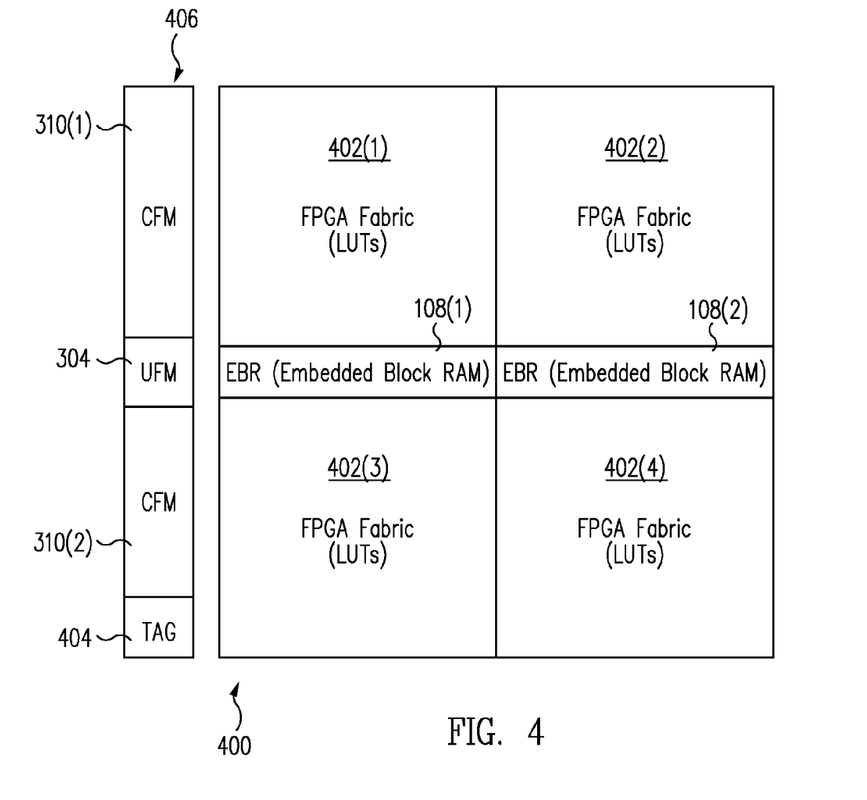
FIGS. 4 and 5 show block diagrams illustrating exemplary implementation details for a programmable logic device in accordance with an embodiment of the present invention.
Figure 5:
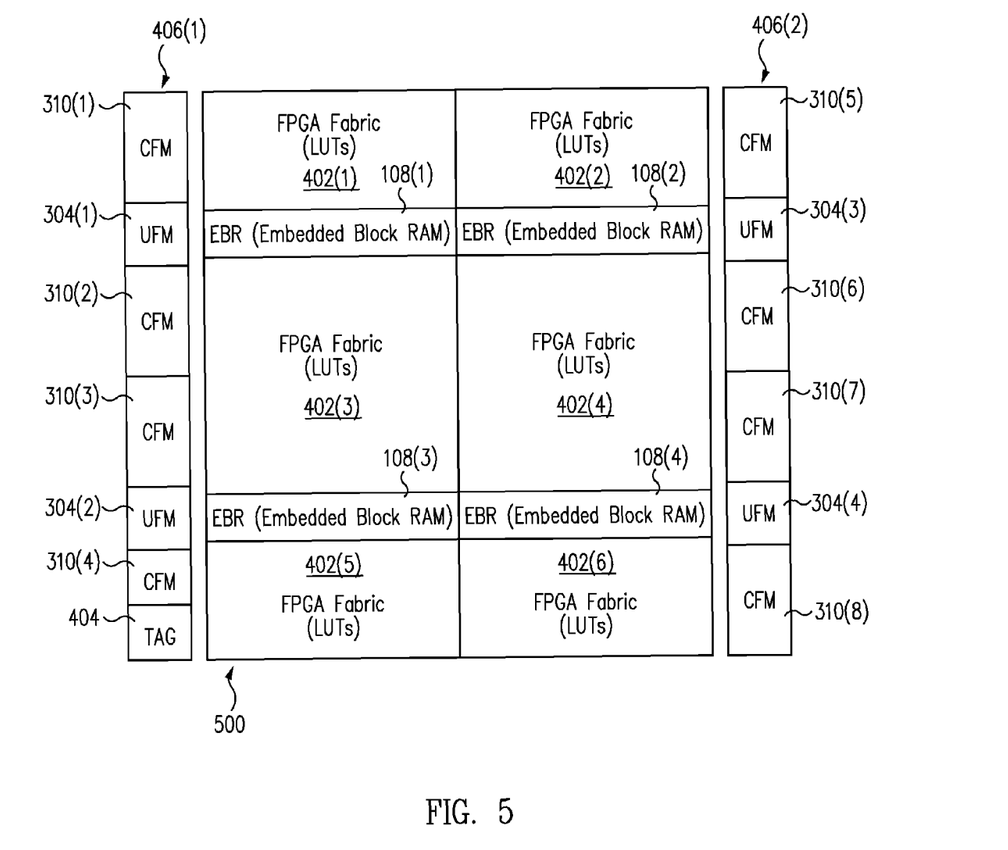

FIGS. 4 and 5 show block diagrams of PLD 400 and PLD 500, respectively, illustrating exemplary implementation details for a PLD (e.g., PLD 100) in accordance with an embodiment of the present invention. For example, PLD 400 illustrates a non-volatile memory 406 (e.g., similar to non-volatile memory 106 or non-volatile memory 302), volatile memory 108, and logic portions 402. Logic portions 402 represent various programmable circuitry of PLD 400 and may include, for example, I/O blocks 102, programmable logic blocks 104, configuration memory 114, and interconnect 116.

Non-volatile memory 406 may be partitioned into user flash portion 304 (UFM) and configuration flash portions 310 (labeled CFM and separately referenced as configuration flash portions 310(1) and 310(2)). Non-volatile memory 406 may further include a tag memory 404 (tag memory portion), which may represent a bank of memory (tag memory) for use as a user and/or manufacturer desires (e.g., a scratchpad memory). As discussed further herein in accordance with one or more embodiments of the present invention, tag memory 404 may provide a memory architecture that provides a variable amount of tag memory (e.g., scales with PLD density) which is flexible, inexpensive, and accessible via a dedicated SPI interface (e.g., direct, sequential access).

Configuration flash portion 310(1) may be used to store the configuration data for transfer to configuration memory 114 within logic portions 402(1) and 402(2), while configuration flash portion 310(2) may be used to store the configuration data for transfer to configuration memory 114 within logic portions 402(3) and 402(4) to configure those portions of PLD 400. User flash portion 304 may be associated with volatile memory 108(1) and/or 108(2). For example, volatile memory 108(1) and 108(2) (e.g., embedded block RAM or EBR) may be mapped into user flash portion 304 and, as explained further herein, a STF operation may be performed (e.g., during a reconfiguration process) to save the information stored in volatile memory 108(1) and 108(2) to user flash portion 304. As a specific example, the information transferred from volatile memory 108(1) and 108(2) to user flash portion 304 may then be transferred back from user flash portion 304 to volatile memory 108(1) and 108(2) during the reconfiguration process but prior to entering user mode of operation so that the information in volatile memory 108(1) and 108(2) is preserved during the reconfiguration process.

PLD 500 of FIG. 5 illustrates that any number of non-volatile memory 406 and volatile memory 108 may be provided and, furthermore, each volatile memory 406 may be partitioned as desired. For example, configuration flash portion 310(1) may be used to store the configuration data for transfer to configuration memory 114 within logic portion 402(1), while configuration flash portion 310(5) may be used to store the configuration data for transfer to configuration memory 114 within logic portion 402(2).

In a similar fashion, user flash portion 304(1) may be associated with and mapped to volatile memory 108(1), while user flash portion 304(3) may be associated with and mapped to volatile memory 108(2). Likewise, configuration flash portions 310(2) and 310(3), 310(4), 310(6) and 310(7), and 310(8) may be associated with logic portions 402(3), 402(5), 402(4), and 402(6), respectively, while user flash portions 304(2) and 304(4) may be associated with and mapped to volatile memory 108(3) and 108(4), respectively. Thus, for example, shadow user flash memory may be provided of variable density, with the amount of shadow user flash available related to the number or amount of volatile memory 108 in the PLD and which may scale with density. Furthermore in accordance with some embodiments, it should be understood that each volatile memory 108 within PLD 500 may be configured independently as shadow user flash or as any other type of conventional memory implementation (e.g., as ROM, RAM, etc.).

In accordance with an embodiment of the present invention, volatile memory 108 may function as the primary interface for user flash portion 304. For example, during user mode of operation, direct access to user flash portion 304 may only be through the associated volatile memory 108 (shadow user flash).

Figure 6:
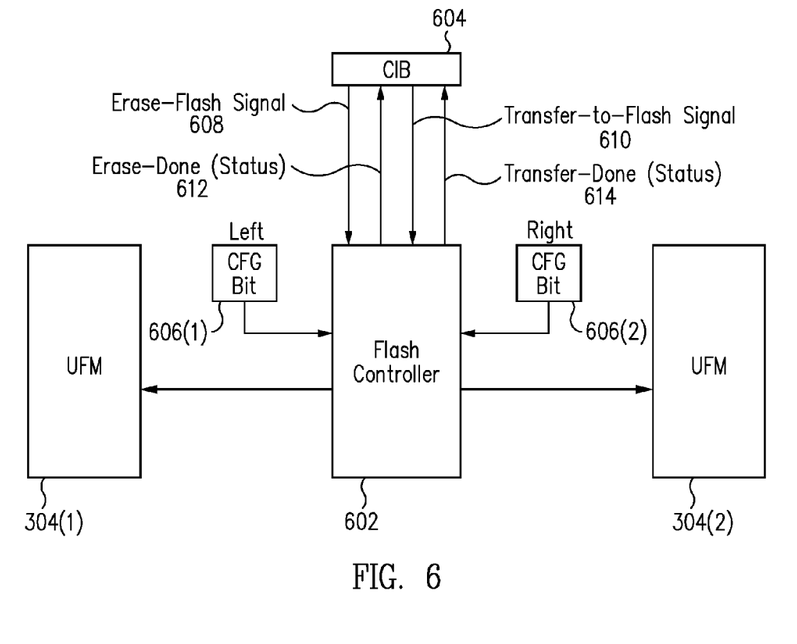
FIG. 6 shows a block diagram illustrating exemplary implementation details of a non-volatile memory controller for the programmable logic device of FIG. 1 in accordance with an embodiment of the present invention.

FIG. 6 shows a block diagram illustrating a PLD 600, which provides exemplary implementation details for a non-volatile memory controller 602 for PLD 100 of FIG. 1 in accordance with an embodiment of the present invention. PLD 600 illustrates, for example, the STF capability for PLD 100 as discussed herein.

For example, controller 602 controls user flash portions 304 (e.g., 304(1) and 304(2)) for transferring information between volatile memory 108 and user flash portions 304 and may be separate from or may be part of control logic 202. As an example, control logic 202 and controller 602 control the transfer of configuration data from non-volatile memory 106 to configuration memory 114 and also control the transfer of information between non-volatile memory 106 (e.g., user flash portions 304) and volatile memory 108.

As a specific implementation example, a store-to-flash signal may be provided to controller 602 to command the information stored in volatile memory 108 to be transferred to the associated mapped user flash portion 304. The store-to-flash signal may be provided, for example, via a common interface block (CIB) 604. As another specific implementation example, in addition to the store-to-flash signal, a flash busy signal and a status signal may be provided by controller 602 to indicate if a flash related operation is in progress (e.g., store-to-flash process) and operations status (e.g., whether the store-to-flash operation passed or failed), respectively.

Each user flash portion 304 may have an associated configuration bit 606 (e.g., one of configuration memory cells 114) for indicating to controller 602 whether associated user flash portion 304 is to be used in the STF capacity (i.e., user flash mode). For example, configuration bits 606(1) and 606(2) are associated with user flash portions 304(1) and 304(2), respectively. Therefore in accordance with one embodiment, controller 602 saves the information in volatile memory 108 based upon the store-to-flash signal and the values stored in configuration bits 606.

Additional information and control signals may be used, as illustrated in FIG. 6. For example, rather than just the store-to-flash signal, controller 602 may instead or in addition receive a flash erase signal 608 and a transfer-to-flash signal 610 and provide an erase done signal 612 and a transfer done signal 614.

Flash erase signal 608 would be used to command controller 602 to erase user flash portions 304 whose configuration bit 606 is appropriately set to designate user flash mode for that user flash portion 304. Once the erasure has been completed, controller 602 may indicate this (e.g., to user logic) via erase done signal 612. Transfer-to-flash signal 610 would then be used to command controller 602 to transfer the information in volatile memory 108 to the associated user flash portion 304. Once the transfer has been completed, controller 602 may indicate this (e.g., to user logic) via transfer done signal 614.

The information stored in user flash portions 304 may be protected from unauthorized access in the same way as is conventionally done for protecting configuration data from unauthorized access from non-volatile memory with the PLD. For example, the data stored in user flash portions 304 and configuration flash portions 310 may be secured from unauthorized reading out by a conventional security fuse, which prevents the reading out from the PLD of the information stored in the embedded non-volatile memory.

Figure 7:
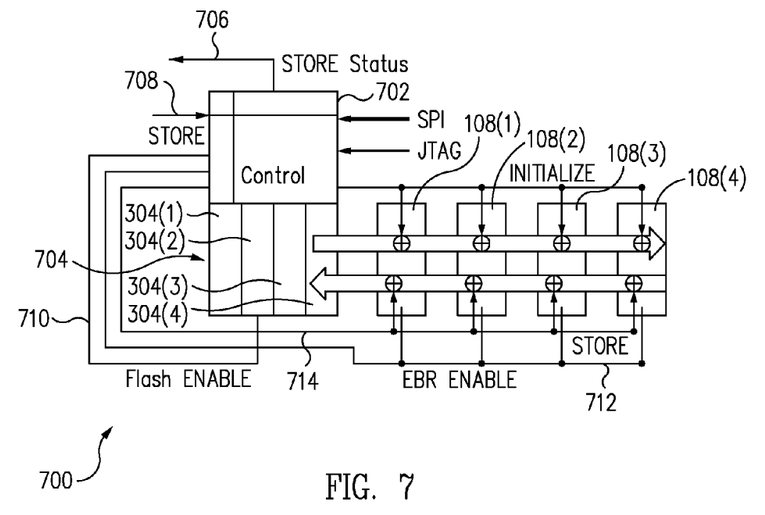
FIG. 7 show a block diagram illustrating exemplary implementation details for data transfer between a non-volatile memory and volatile memory for the programmable logic device of FIG. 1 in accordance with an embodiment of the present invention.

FIG. 7 show a block diagram illustrating a PLD 700, which provides exemplary implementation details for data transfer between a non-volatile memory 704 and volatile memory 108 for PLD 100 of FIG. 1 in accordance with an embodiment of the present invention. Non-volatile memory 704 for this exemplary implementation may represent four user flash portions 304 (i.e., user flash portions 304(1) through 304(4)) that correspond to volatile memory 108(1) through 108(4). Control logic 702 may represent controller 602 (FIG. 6) or represent controller 602 and control logic 202 (FIG. 1) and it should be understood that other circuitry within PLD 700 is not shown for clarity.

Volatile memory 108(1) through 108(4), for example, have been configured by a user pattern to function as user flash memory, RAM, RAM, and ROM, respectively. Consequently in accordance with an embodiment of the present invention, user flash portions 304(1) through 304(4) may provide non-volatile storage for corresponding volatile memory 108(1) through 108(4) if, for example, the associated configuration bit 606 designates user flash mode.

For example, FIG. 7 illustrates, with the bold arrow from non-volatile memory 704 through volatile memory 108, the ability to transfer data from non-volatile memory 704 to volatile memory 108 to initialize volatile memory 108 with desired data. For example, control logic 702 may provide an enable signal 712 (labeled EBR enable) to volatile memory 108 to enable volatile memory 108 to store the data provided by non-volatile memory 704.

Control logic 702 may be controlled, for example, via SPI or JTAG ports (e.g., via data port 112) during the store-to-flash operation or to initiate the store-to-flash operation. As an example, a store signal 708 provided to control logic 702 may include flash erase signal 608 and transfer-to-flash signal 610, while control logic 702 may provide a store status signal 706 that includes erase done signal 612 and transfer done signal 614, with these signals used as described in reference to FIG. 6.

PLD 700 may be viewed, for an operational example, as operating in a user mode of operation as configured by a user pattern (i.e., a user defined pattern "A"). If a user desires to reconfigure PLD 700, non-volatile memory 704 may be erased (e.g., write all logical high values "1" by command of flash erase signal 608) and then a new user pattern (i.e., a user defined pattern "B") may be written to non-volatile memory 704, while PLD 700 operates in user mode with user defined pattern "A" (e.g., background programming operation performed). For example, non-volatile memory 704 may now store a default pattern (e.g., store all logical low values "0"), except for section 304(4) corresponding to volatile memory block 108(4) that a user desires to function as ROM and thus section 304(4) stores the desired ROM data (e.g., the same ROM data or different ROM data as in user defined pattern "A").

Prior to transferring the user defined pattern "B" into configuration memory 114 from configuration flash portions 310, a user may desire to preserve the data stored in volatile memory 108. Therefore, as illustrated in FIG. 7 by the bold arrow from volatile memory 108 to non-volatile memory 704, a store-to-flash operation (e.g., by command of transfer-to-flash signal 610) may be performed to transfer the data stored in volatile memory 108(1), 108(2), 108(3), and/or 108(4) to user flash portions 304(1), 304(2), 304(3), and/or 304(4), respectively, to preserve the data during the reconfiguration process.

During the store-to-flash operation, control logic 702 may provide a store control signal 714 to volatile memory 108 and a flash enable control signal 710 to non-volatile memory 704 to control the transfer and storage of data from volatile memory 108 to non-volatile memory 704. Upon completion of the store-to-flash operation, the refresh operation may be performed to reconfigure PLD 700. For example for the refresh operation, the configuration data stored in configuration flash section 310 may be transferred to configuration memory 114, and the data stored and preserved in non-volatile memory 704 may be transferred to volatile memory 108. The refresh operation may be initiated, for example, by powering down and then powering up PLD 700, toggling a program pin of PLD 700, or sending a refresh command to PLD 700 (e.g., via an SPI interface or JTAG port).

Thus in general in accordance with some embodiments of the present invention, systems and methods are disclosed herein to provide improved non-volatile storage techniques for programmable logic devices. For example, in accordance with an embodiment of the present invention, a non-volatile PLD (e.g., FPGA) with user flash is disclosed that provides for the preservation of user data within volatile memory blocks. For example in accordance with some embodiments, the PLD includes flash memory that is partitioned into configuration flash and user flash sections, with the user flash sections associated with the volatile memory blocks. Consequently, the volatile memory blocks may be configured to function as shadow user flash, with the information transferred to the corresponding user flash sections when desired by a user to preserve the information (e.g., during a reconfiguration or power down of the PLD).

As another example and as noted herein (e.g., in reference to FIG. 4) in accordance with one or more embodiments of the present invention, techniques are also disclosed to provide immediate access to non-volatile memory (i.e., tag memory) within the PLD by a user and/or manufacturer to store desired information. The tag memory is provided within the PLD, which may or may not have the store-to-flash capability (e.g., a volatile memory and corresponding non-volatile memory), in accordance with some embodiments of the present invention.

As an example, conventional PLDs may have embedded non-volatile memory that could be used by a user of the PLD to store information other than configuration data. However, the PLD typically must be configured to provide an interface prior to the user having direct access (e.g., non-JTAG access) to the non-volatile memory. In contrast, techniques are disclosed herein to provide direct access to tag memory 404 without configuring the PLD.

Figure 8:
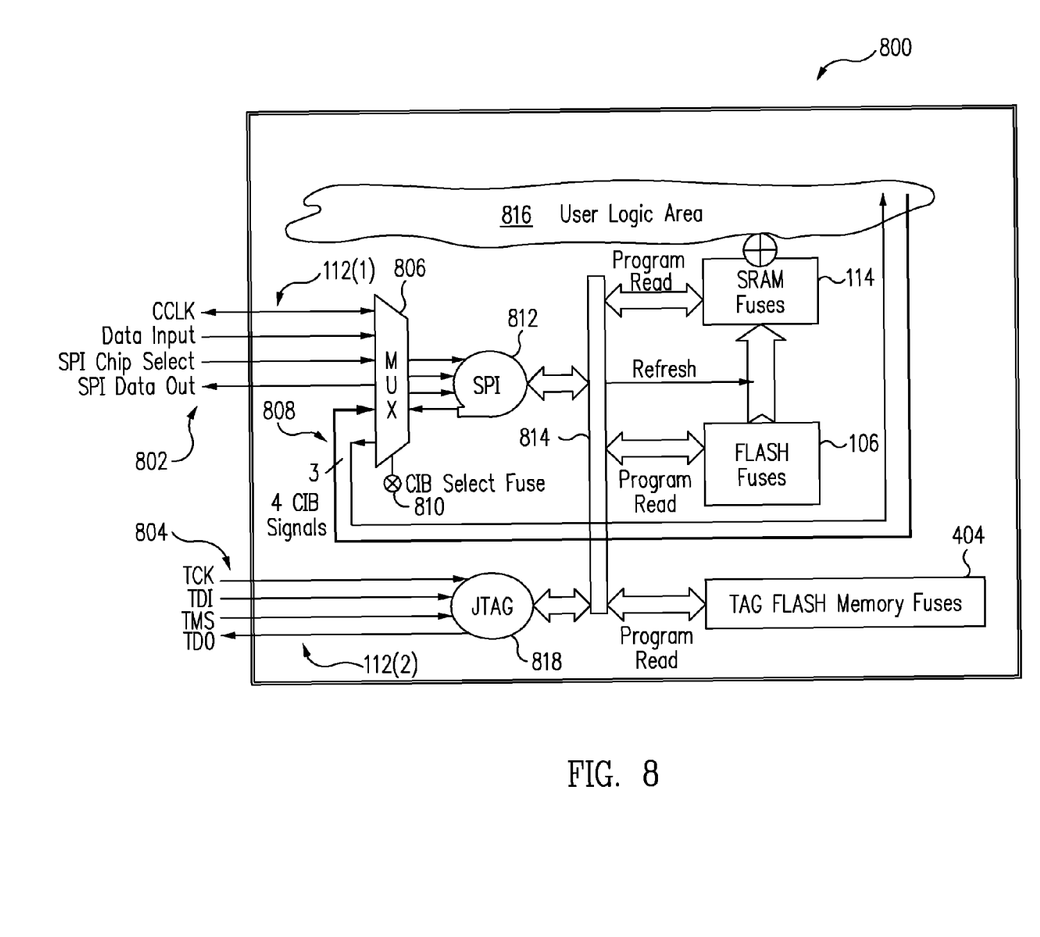
FIG. 8 shows a block diagram illustrating exemplary implementation details for accessing a non-volatile memory of the programmable logic device of FIG. 1 in accordance with an embodiment of the present invention.
Figure 9:
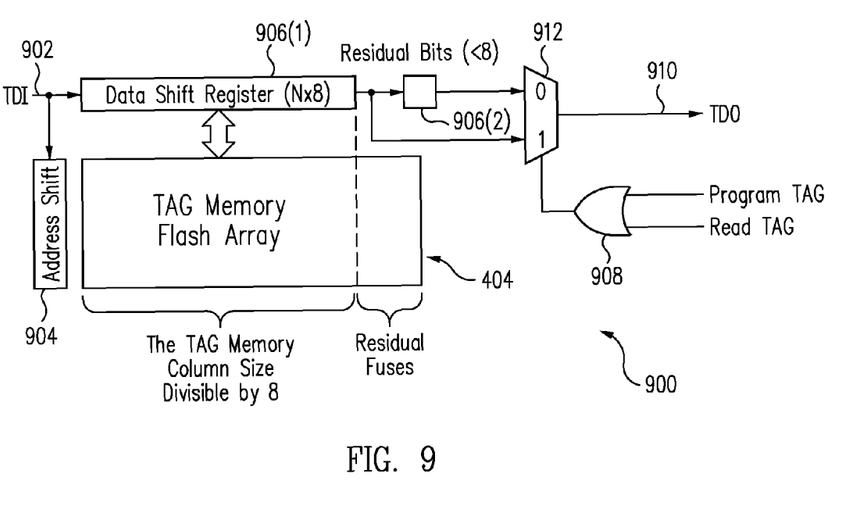
FIG. 9 shows a block diagram illustrating additional exemplary implementation details for accessing a non-volatile memory of the programmable logic device of FIG. 1 in accordance with an embodiment of the present invention.

For example, FIGS. 8 and 9 illustrate PLDs 800 and 900, which provide exemplary implementation details for a PLD (e.g., PLD 100 or PLD 400) for accessing tag memory 404 in accordance with an embodiment of the present invention. Specifically referring to FIG. 8, PLD 800 illustrates techniques for accessing tag memory 404 via data port 112(1), which represents an SPI interface (e.g., a dedicated, hardwired slave serial peripheral interface (SPI) port providing a 4-wire serial interface) in accordance with an embodiment of the present invention. PLD 800 includes data port 112(1) and its SPI interface block 812, an interface circuit 814 (e.g., a common interface block (CIB) or an arbitration bus), and tag memory 404 (e.g., flash memory fuses).

Data port 112(1) supports the communication of SPI signals 802 (labeled CCLK (CLK), Data Input (SOSPI), SPI Chip Select (CSSPISN), and SPI Data Out (SISPI)) for programming and reading tag memory 404, as would be understood by one skilled in the art. Tag memory 404 of FIG. 8 may represent flash memory fuses, which may or may not be formed as part of the flash fuses of non-volatile memory 106 in accordance with one or more embodiments of the present invention.

SPI signals 802 may be received by SPI interface block 812 via a multiplexer 806, which selects between SPI signals 802 and signals 808 from user logic 816 to provide to SPI interface block 812. Multiplexer 806 may be controlled, for example, by a select fuse 810 (e.g., a memory cell from configuration memory 114 or non-volatile memory 106) for selecting between SPI signals 802 and signals 808, with the default (i.e., unprogrammed state of select fuse 810) for example being to select SPI signals 802. Thus for this example, select fuse 810 must be programmed to control multiplexer 806 to route signals 808 (e.g., from a CIB within user logic 816) between SPI interface block 812 and user logic 816.

SPI signals 802 may be provided between PLD 800 and an external master SPI device (e.g., a CPU and/or master SPI flash device, not shown) to allow the master SPI device to program and read tag memory 404 via SPI interface block 812 and interface circuit 814. Signals 808 may be provided between SPI interface block 812 (i.e., via multiplexer 806) and user logic 816, which may represent any type of user-defined logic (e.g., including logic configured in programmable logic blocks 104), to allow user logic 816 to program and read tag memory 404 via SPI interface block 812 and interface circuit 814.

Interface circuit 814 is used as a general interface for communication of signals between SPI interface block 812 and tag memory 404. Interface circuit 814 may also be used as a general interface for communication of signals between SPI interface block 812 and configuration memory 114 and/or non-volatile memory 106 to provide program, read, and/or refresh signals, as illustrated.

Data port 112(2) may also optionally be provided to support JTAG signals 804 (labeled TCK, TDI, TMS, and TDO) for interfacing PLD 800 and JTAG interface block 818 with external devices supporting JTAG interfaces. As shown, interface circuit 814 may also be used as a general interface between JTAG interface block 818 and tag memory 404, non-volatile memory 106, and/or configuration memory 114 to provide program, read, and/or refresh signals, as illustrated. For example, interface circuit 814 may represent an arbitration bus for SPI interface block 812 and JTAG interface block 818, with for example JTAG interface block 818 (e.g., a JTAG engine) having higher priority than SPI interface block 812 (e.g., an SPI engine). Thus, if SPI interface block 812 and JTAG interface block 818 are being accessed in parallel by a user of PLD 900 through corresponding data ports 112(1) and 112(2), interface circuit 814 functioning as an arbitration bus would give higher priority to JTAG interface block 818 than SPI interface block 812 (e.g., ignore SPI interface block 812).

Consequently in accordance with one or more embodiments of the present invention, a dedicated SPI interface is disclosed. This dedicated interface, which is independent of the PLD configuration memory, provides a user the ability to program and read tag memory 404, whether or not PLD 800 is configured. Optionally, a JTAG port is also provided for a user to program and read tag memory 404. Furthermore in accordance with an embodiment of the present invention, tag memory 404 may be read and programmed selectively under control from user logic 816 that is implemented by a user within PLD 800. Additionally in accordance with an embodiment of the present invention, configuration memory 114 may be programmed, refreshed, and/or read and non-volatile memory 106 may be programmed and read under control from user logic 816, SPI signals 802, and/or JTAG signals 804.

PLD 900 of FIG. 9 illustrates additional exemplary implementation details for accessing tag memory 404 in accordance with an embodiment of the present invention. Specifically, PLD 900 illustrates exemplary JTAG details for JTAG interface block 818 of PLD 800 and an exemplary bit arrangement for tag memory 404.

In general for example, tag memory 404 may represent a block of flash memory that is available for write (programming) and read operations through data port 112(1). For example, the write and read operations may occur as desired by a user, whether PLD 900 is in a programmed or unprogrammed state (e.g., PLD 900 is blank). However, it should be understood that if data port 112(1) is designed to permit BSCAN test control or is being used for programming of PLD 900 or other operations under control of a user, then there may be certain time periods where data port 112(1) is being used and a user may not be able to immediately access tag memory 404 via data port 112(1). It should also be understood that tag memory 404 may be tested and accessed by the PLD manufacturer via data port 112(2), if available.

Tag memory 404 as shown in FIG. 9 may be arranged such that the fuse array organization has, for example, a column size byte bounded (i.e., divisible by or a multiplication of eight). As an example in accordance with an embodiment of the present invention, tag memory 404 may be formed as part of non-volatile memory 106 that is not byte bounded (e.g., 11 bits rather than the limited 8 bits for tag memory 404). Thus, as shown in FIG. 9, a data shift register 906 may be segmented into an eight-bit portion (906(1)), with "N" equal to one, and a three-bit portion (906(2)) for this example, with the three-bit portion 906(2) storing the unused data from the residual fuses of tag memory 404.

As an exemplary operation for PLD 900, if a program TAG control signal or a read TAG control signal is asserted (e.g., provides a logical high value) to a logic gate 908 to provide a program operation or a read operation of tag memory 404, then logic gate 908 provides a logical high value to control a multiplexer 912 to bypass the residual bits of data shift register 906(2) and only provide the eight bits in data shift register 906(1) as output data on a JTAG TDO path 910. If non-volatile memory 106 data not associated with tag memory 404 is being provided on a JTAG TDI path 902 or is being accessed, then logic gate 908 provides a logical low value to multiplexer 912 to allow the 11-bit data of data shift register 906(1) and 906(2) through multiplexer 912 to TDO path 910.

If more than one row is provided for tag memory 404, an address shift register 904 may be provided to access each row. It should be understood that the same address shift register and instruction/command may be used to access the rows of tag memory 404. For example, a TAG ENABLE instruction/command may be sufficient to distinguish between accessing non-volatile memory 106 storing configuration data and the portion of non-volatile memory 106 used as tag memory 404. If tag memory 404 has multiple rows, the Program_TAG instruction/command and Read_TAG instruction/command to the address shift register may become Program_TAG_INCR and Read_TAG_INCR, respectively, as would be understood by one skilled in the art.

In general, tag memory 404 may be used with a basic instruction set for a user to perform the desired functions for tag memory 404. For example, the instruction set may include READ_TAG, ERASE_TAG, PROG_TAG, VERIFY_TAG, AND TAG_ENABLE instructions for reading, erasing, programming, verifying, and enabling (programming, reading, and verification), respectively, of tag memory 404, as would be understood by one skilled in the art. Tag memory 404 may be accessed, as discussed herein, via a dedicated SPI interface (data port 112(1)) and by an optional JTAG port (data port 112(2)). The dedicated SPI interface, for example, allows a user to access tag memory 404 regardless of whether the PLD is programmed. Thus for example, by providing an SPI compliant interface, a user may access tag memory 404 as desired to program, read, and/or erase tag memory 404.

Figure 10:
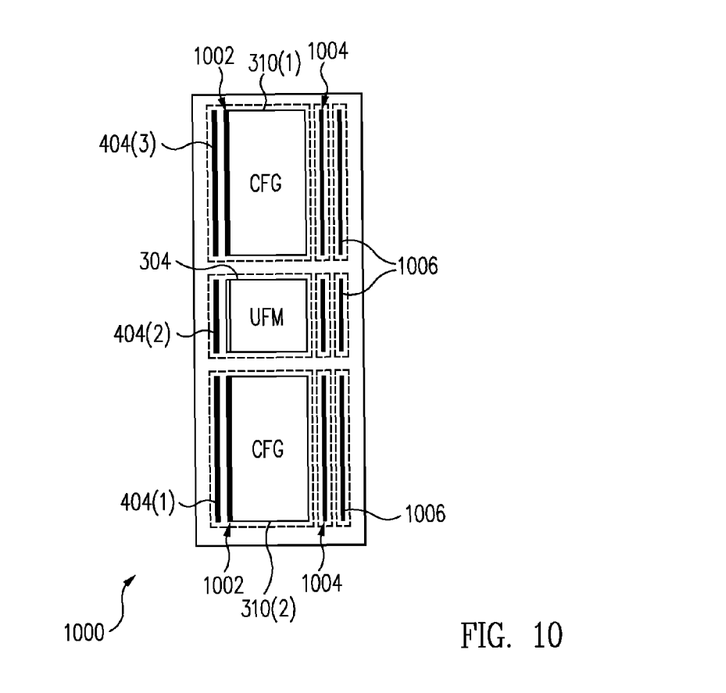
FIG. 10 shows a block diagram illustrating exemplary implementation details for a non-volatile memory of the programmable logic device of FIG. 1 in accordance with an embodiment of the present invention.

FIG. 10 shows a block diagram of a non-volatile memory 1000, which illustrates exemplary implementation details for non-volatile memory 106 of PLD 100 of FIG. 1 in accordance with an embodiment of the present invention. Non-volatile memory 1000 includes configuration flash portions 310, one or more rows of tag memory 404 (shown as sections 404(1) through 404(3)), and user flash portion 304. Tag memory 404 may have one or more rows and columns, with tag memory 404 scalable with PLD density (e.g., 448 bits to 3,608 bits or more of memory).

Non-volatile memory 1000 may further include one or more additional sections 1002, 1004, and 1006 of flash memory for storing information. For example, section 1002 may represent one or more rows of flash memory for storing security information (e.g., security bits) and user electronic signatures (e.g., user security or identifiable electronic codes) and other related user information. Similarly, section 1004 may represent one or more rows of flash memory for storing trim data (e.g., represents trim portion 306) and test information (e.g., represents test portion 308), while section 1006 may represent one or more rows of flash memory for storing various other information as desired by a user and/or the PLD manufacturer.

In general, systems and methods are disclosed herein to provide a flexible tag memory architecture for PLDs. For example, in accordance with an embodiment of the present invention, a PLD is disclosed having an independent program, read, and erase capability via a dedicated SPI interface for the tag memory to provide immediate sequential access to optimize die size and minimize costs.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
a plurality of logic blocks;
a plurality of input/output blocks;
volatile memory adapted to store configuration data for configuration of the logic blocks and input/output blocks and further adapted to store user data;
non-volatile memory;
first and second data ports adapted to provide external device access to the non-volatile memory; and
an arbitration bus coupled between the first and second data ports and the non-volatile memory, the bus adapted to arbitrate between the two data ports in accessing the non-volatile memory;
wherein the non-volatile memory is adapted to store user data from at least one of the data ports and is further adapted to store user data from the volatile memory.

2. The programmable logic device of claim 1, wherein the non-volatile memory is further adapted to transfer the user data stored therein to at least one of the data ports.

3. The programmable logic device of claim 1, wherein the non-volatile memory is further adapted to transfer user data stored therein to the volatile memory.

4. The programmable logic device of claim 1, wherein the volatile memory includes configuration memory for storing configuration data and embedded block RAM for storing user data.

5. The programmable logic device of claim 1, wherein the non-volatile memory includes tag memory.

6. The programmable logic device of claim 1, wherein the first data port includes a serial peripheral interface.

7. The programmable logic device of claim 1, wherein the first data port includes a serial peripheral interface and the second data port includes a JTAG interface.

8. A programmable logic device comprising:
a plurality of logic blocks;
a plurality of input/output blocks;
volatile configuration memory adapted to store configuration data for configuration of the logic blocks and input/output blocks;
embedded block RAM adapted to store user data;
flash memory having at least a first partition and a second partition;
a first data port adapted to provide external device access to the first partition of the non-volatile memory;
a second data port adapted to provide external access to the first partition of the flash memory; and
an arbitration bus coupled between the first and second data ports and the first partition of the flash memory, the bus adapted to arbitrate between the two data ports in accessing the flash memory,
wherein the flash memory is adapted to store within the first partition user data from at least one of the data ports and is further adapted to store within the second partition user data from the embedded block RAM.

9. The programmable logic device of claim 8, wherein the first data port includes a serial peripheral interface and the second data port includes a JTAG interface.

10. The programmable logic device of claim 8, wherein the flash memory includes a third partition adapted to store configuration data for transfer to the volatile memory.

11. A programmable logic device comprising:
a plurality of logic blocks;
a plurality of input/output blocks;

volatile memory adapted to store configuration data for configuration of the logic blocks and input/output blocks and further adapted to store user data;

non-volatile memory having at least a first part and a second part;

first and second data ports each adapted to provide external device access to the first part of the non-volatile memory; and an arbitration bus coupled between the first and second data ports and the first part of the non-volatile memory, the bus adapted to arbitrate between the two data ports in accessing the non-volatile memory, wherein the non-volatile memory is adapted to store within the first part user data from at least one of the data ports and is further adapted to store within the second part user data from the volatile memory.

12. The programmable logic device of claim 11, wherein the first and second parts of the non-volatile memory are first and second partitions of the non-volatile memory.

13. The programmable logic device of claim 11, wherein the first and second parts of the non-volatile memory are first and second non-volatile memories.

14. The programmable logic device of claim 11, wherein the non-volatile memory includes a third part adapted to store configuration data for transfer to the volatile memory.

15. The programmable logic device of claim 11, wherein the non-volatile memory is further adapted to transfer user data stored in the first part to at least one of the data ports.

16. The programmable logic device of claim 11, wherein the non-volatile memory is further adapted to transfer user data stored in the second part to the volatile memory.

17. The programmable logic device of claim 11, wherein the first data port includes a serial peripheral interface and the second data port includes a JTAG interface.

18. The programmable logic device of claim 11, wherein the volatile memory includes configuration memory for storing configuration data and embedded block RAM for storing user data.

* * * * *